United States Patent [19]

Ikebe

[11] Patent Number: 5,569,964
[45] Date of Patent: Oct. 29, 1996

[54] SEMICONDUCTOR DEVICE

[75] Inventor: Kimihiro Ikebe, Kawasaki, Japan

[73] Assignee: Kabushiki Kaisha Toshiba, Kawasaki, Japan

[21] Appl. No.: 363,321

[22] Filed: Dec. 23, 1994

[30] Foreign Application Priority Data

Dec. 27, 1993 [JP] Japan .................................. 5-332755
Nov. 29, 1994 [JP] Japan .................................. 6-295226

[51] Int. Cl.$^6$ .......................... H01L 23/48; H01L 23/52; H01L 29/40
[52] U.S. Cl. .......................... 257/780; 257/781; 257/786
[58] Field of Search .................................. 257/779, 780, 257/781, 786, 737, 738

[56] References Cited

U.S. PATENT DOCUMENTS 4,866,504  9/1989  Landis .
5,173,763  12/1992 Cipolla et al. .......................... 257/780
5,349,238  9/1994  Ohsawa et al. .......................... 257/781

FOREIGN PATENT DOCUMENTS 63-124434  10/1988  Japan .
3196634    11/1991  Japan .

OTHER PUBLICATIONS

European Search Report, dated Jun. 2, 1995.
IBM Technical Disclosure Bulletin, "Unique Pad Geometry For Optimum Solder Application," vol. 34, No. 1, Jun. 1991; pp. 465–466.
IBM Technical Disclosure Bulletin, "Novel Footprint Design For Tab Assembly," vol. 34, No. 10A, Mar. 1992; pp. 331–332.

Primary Examiner—Sara W. Crane
Assistant Examiner—S. V. Clark
Attorney, Agent, or Firm—Finnegan, Henderson, Farabow, Garrett & Dunner, L.L.P.

[57] ABSTRACT

A semiconductor chip has a shape of a quadrangle. Bumps are arranged in a staggered fashion along at least one side of the semiconductor chip, and include first bumps and second bumps arranged inside the first bumps. If each of the first bumps has a maximum width Bw1 and each of the second bumps has a maximum width Bw2 in a direction parallel to at least one side of the semiconductor chip, Bw2>Bw1. If each of the first bumps has a maximum length Bd1 and each of the second bumps has a maximum length Bd2 in a direction perpendicular to at least one side of the semiconductor chip, Bd1>Bd2.

14 Claims, 13 Drawing Sheets

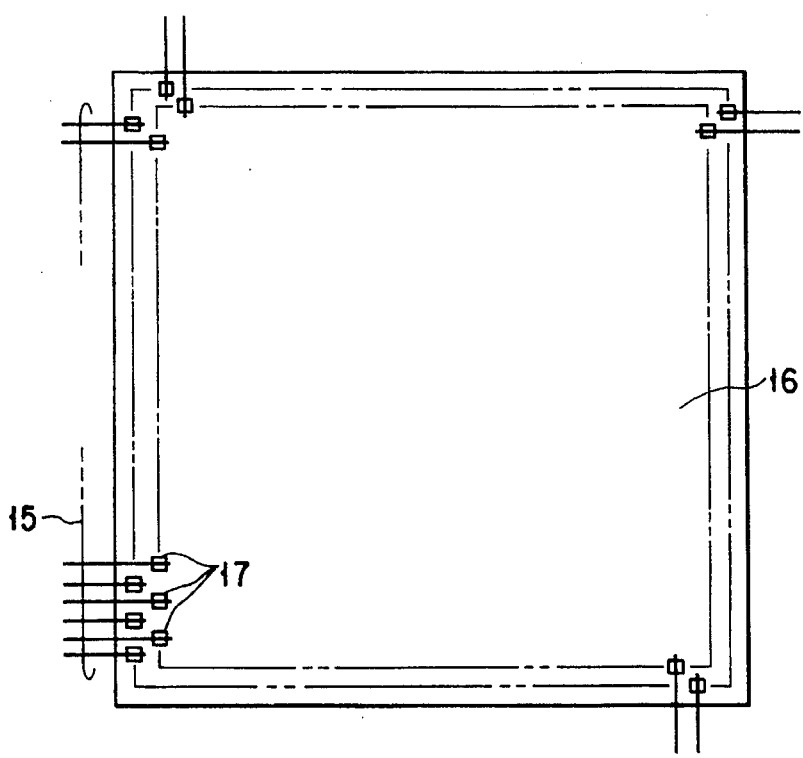
F I G. 4

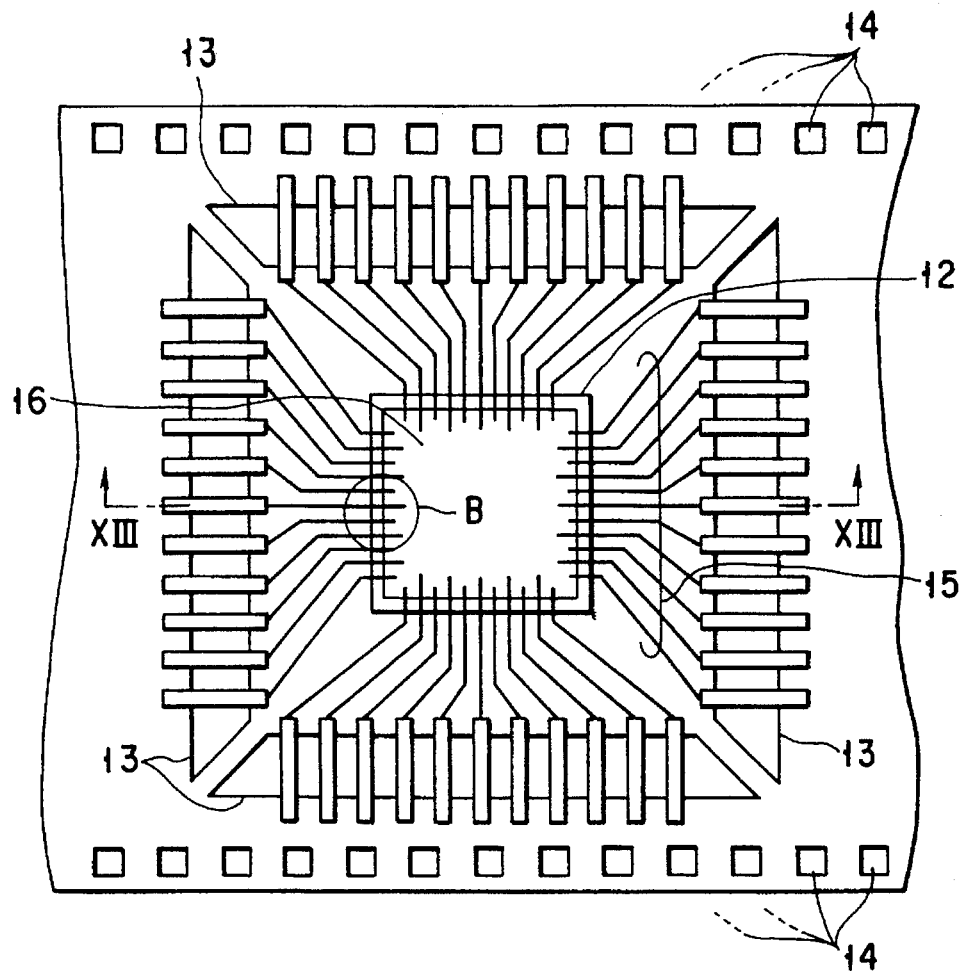
F I G. 12
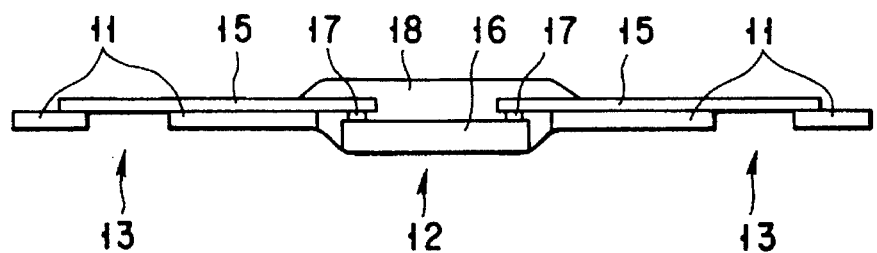
F I G. 13

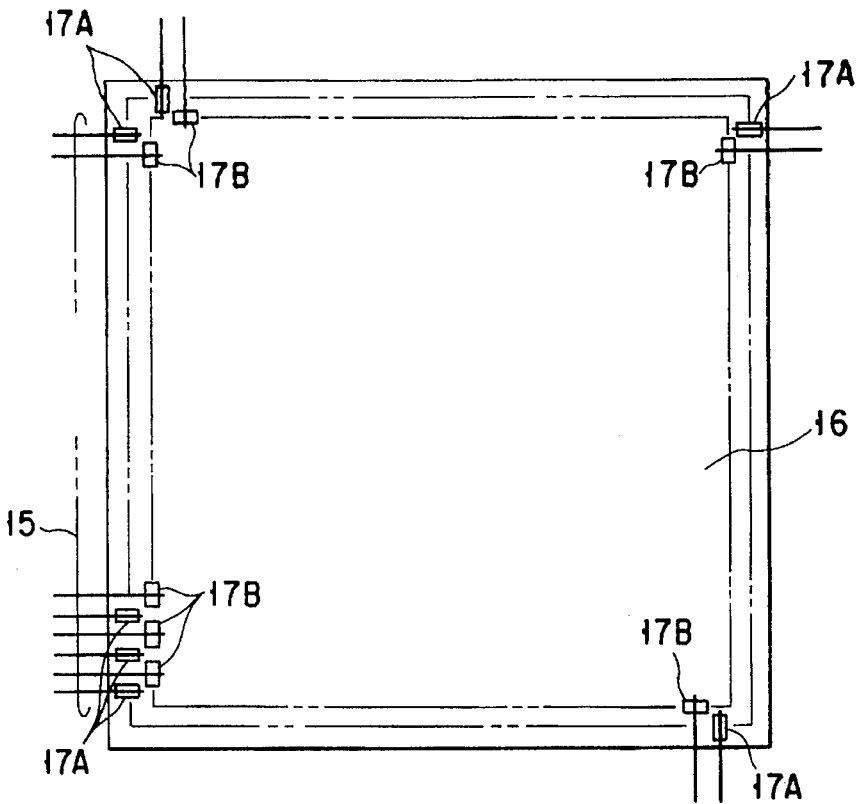
F I G. 14
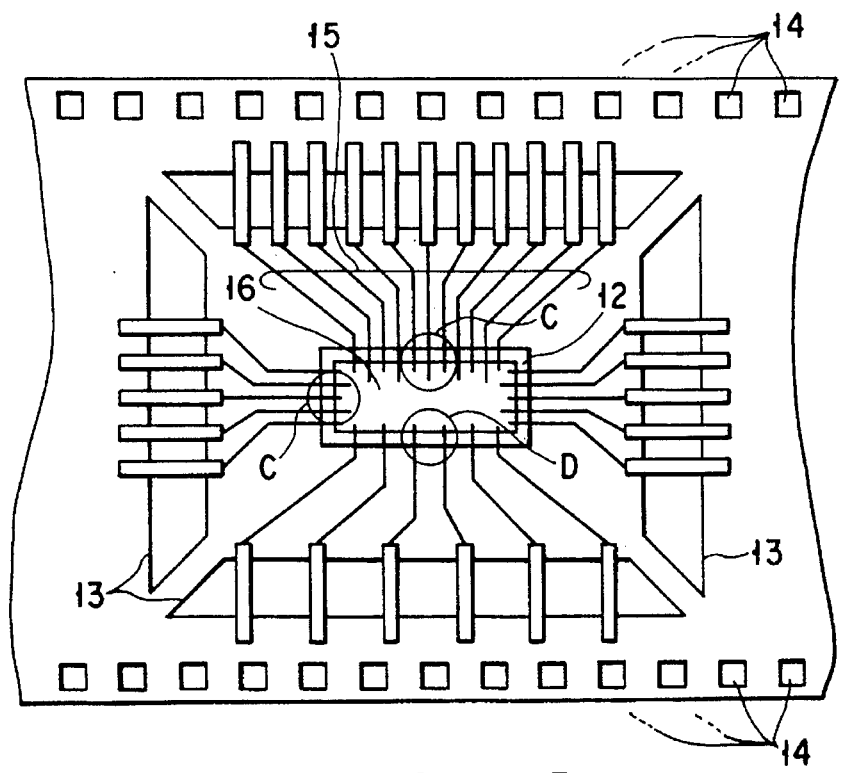
F I G. 15

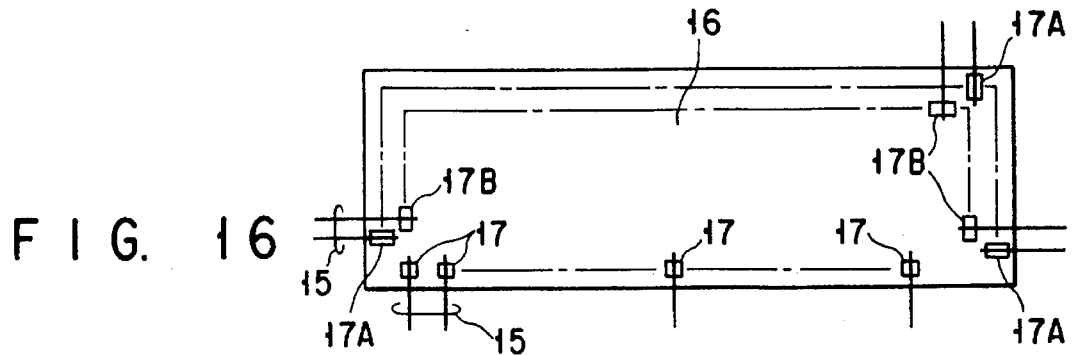
F I G. 16
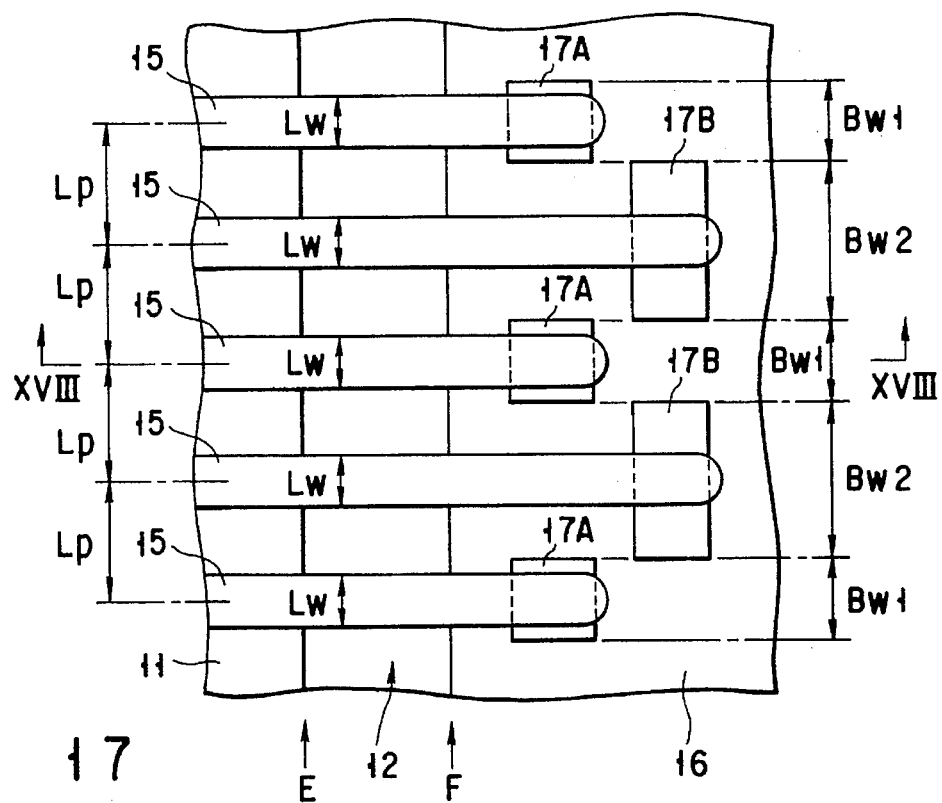
F I G. 17
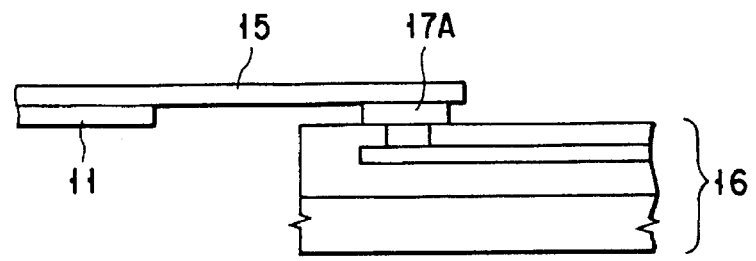
F I G. 18A

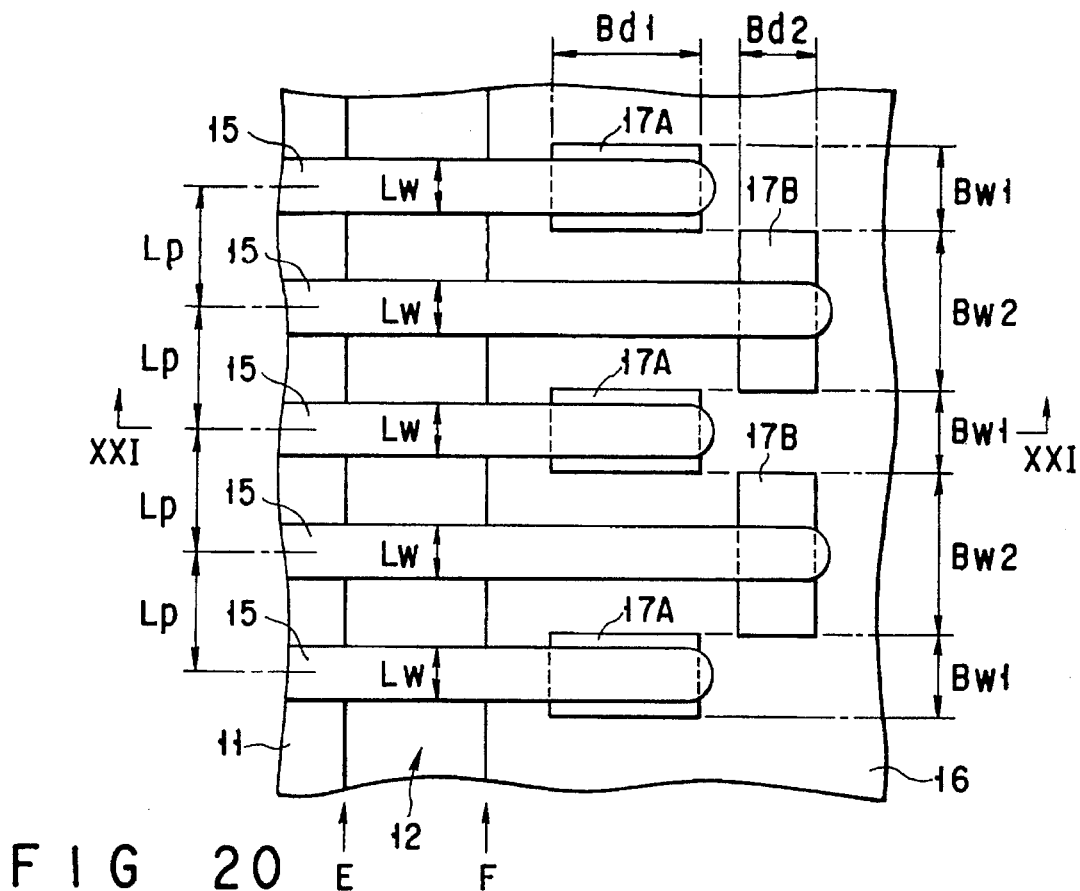
F I G 20
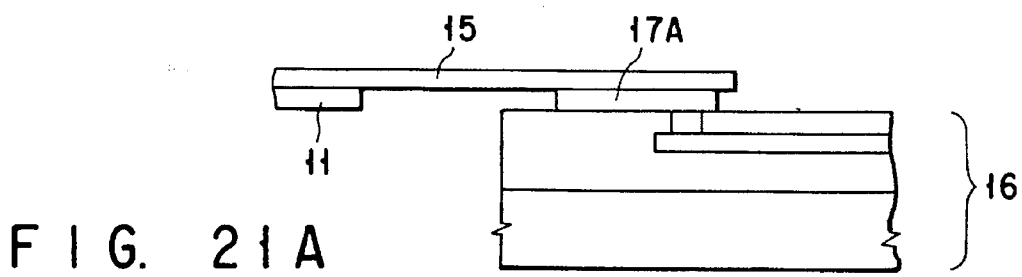
F I G. 21A
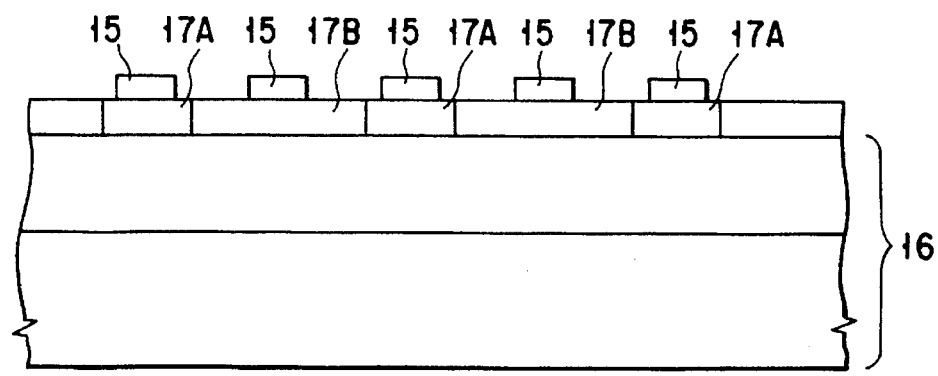
F I G. 21B

FIG. 23(c) PRESENT INVENTION

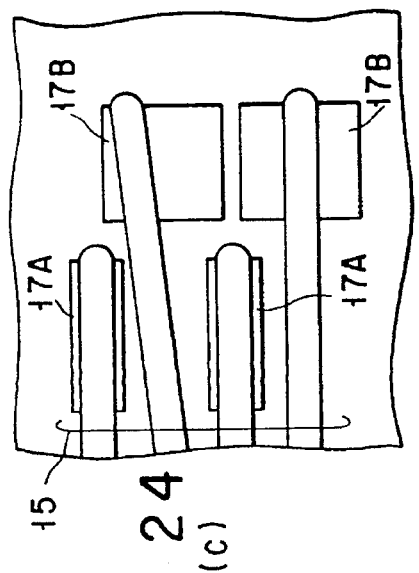
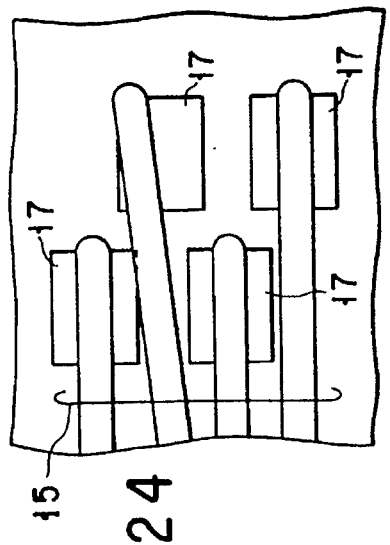 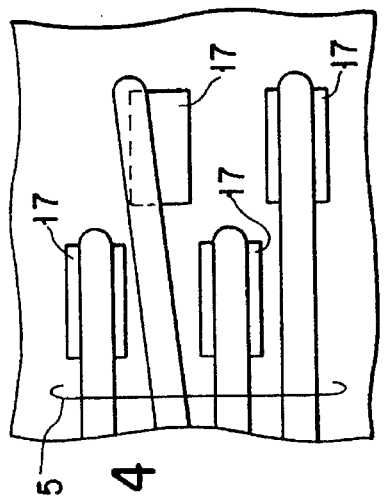
FIG. 24(a)  FIG. 24(b)  FIG. 24(c)

SEMICONDUCTOR DEVICE

BACKGROUND OF THE INVENTION

1. Field of the Invention

The present invention relates to an electrode structure of a TCP (Tape Carrier Package) semiconductor chip.

2. Description of the Related Art

As an electronic apparatus improves in function, the number of pins of an LSI package mounted on the electronic apparatus increases, and the pitch between adjacent pins is narrowed, whereas the LSI package is required to be thinned in accordance with miniaturization of the electronic apparatus. In order to meet the requirement under the conditions that the pins are increased and the pitch is narrowed, a TCP using a TAB (Tape Automated Bonding) system is widely used.

FIG. 1 is a view of a conventional TCP, and FIG. 2 is a cross-sectional view taken along the line II—II of FIG. 1.

An insulation tape 11 includes a device hole 12, outer lead holes 13, and perforation holes 14. The outer lead holes 13 are arranged so as to surround the device hole 12. The perforation holes 14 are arranged along the two opposed sides of the insulation tape 11. Leads 15 are formed on the insulation tape 11, and each have one end extending into the device hole 12 and the other end extending outside the outer lead holes 13. A semiconductor chip 16 is located within the device hole 12. One end of each lead 15 is connected to its corresponding one of bumps 17 on the chip 16. The semiconductor chip 16 and its periphery are covered with resin 18. The insulation tape 11 is formed by resin such as polyimide and polyester. While the leads 15 are formed by, e.g., copper (Cu), the bumps 17 are formed by, e.g., gold (Au).

FIG. 3 is an enlarged view of the circled area A shown in FIG. 1, and FIG. 4 is also an enlarged view of the semiconductor chip 16 and its peripheral portion.

The bumps 17 are arranged in a staggered fashion on the periphery of the semiconductor chip 16 and, in other words, the bumps 17 are arranged on the periphery of the chip 16 so as to form a double ring. All the bumps 17 forming the inner and outer rings of the double ring have the same size and the same shape, such as a square shape.

There are two distances between the edge of the device hole 12 and one end of each of the leads 15 since the long and short leads 15 are alternated with each other. While the short leads 15 are connected to the bumps 17 forming the outer ring, the long ones are connected to the bumps 17 forming the inner ring. This arrangement of the leads 15 and bumps 17 is effective in providing a semiconductor device capable of resolving the problem that the pins are increased in number and the pin pitch is narrowed.

However, when the leads 15 are bent on the insulation tape 11, or when the tape 11 and chip 16 are not aligned exactly, there occurs a drawback in which the bonding strength of leads 15 and bumps 17 is lowered, and adjacent leads 15 are short-circuited with each other.

FIG. 5 shows a case where the bonding strength of leads 15 and bumps 17 is decreased because of a bend of the leads 15. The more bent the leads 15, the smaller the area of regions overlapping the leads 15 and bumps 17, indicated by hatching in FIG. 5. Inevitably the small overlapping regions decrease the bonding strength of leads 15 and bumps 17.

FIGS. 6 and 7 show a case where the bonding strength of leads 15 and bumps 17 is lowered because of inexact alignment of the insulation tape 11 and semiconductor chip 16. More specifically, when the chip 16 is displaced in parallel with the edge of the device hole 12 (FIG. 6) or when it is rotated within the device hole 12 (FIG. 7), the area of regions overlapping the leads 15 and bumps 17, also indicated by hatching, is decreased as the displacement or rotation becomes greater. Inevitably the decrease in the overlapping regions decreases the bonding strength of the leads 15 and bumps 17.

FIG. 8 shows another example of arrangement of the bumps 17 on the semiconductor chip 16. Each of the bumps 17 has a rectangle one side of which is parallel to the edge of the chip 16 and longer than the other side perpendicular to the edge thereof. All the bumps 17 have the same shape and the same size. This shape allows the bonding strength of leads 15 and bumps 17 to be secured sufficiently even though the leads 15 are bent or the tape 11 and chip 16 are not aligned accurately.

If, however, the leads 15 are bent as shown in FIG. 9, or the tape 11 and chip 16 are displaced as shown in FIGS. 10 and 11, there occurs a drawback in which a short circuit is caused between adjacent leads 15.

As described above, conventionally, the bumps of the semiconductor chip are arranged in a staggered fashion in order to resolve the problem that the pins are increased in number and the pin pitch is narrowed. However, this arrangement lowers the bonding strength of leads and bumps and causes adjacent leads to be short-circuited when the leads are bent or the insulation tape and chip are not aligned exactly.

SUMMARY OF THE INVENTION

The present invention has been developed in order to eliminate the above drawbacks, and its object is to provide a semiconductor device which is capable of resolving the problem that the number of pins is increased and the pitch between the pins is narrowed, and which allows the bonding strength of leads and bumps to be secured sufficiently and prevents the leads from being short-circuited even though the leads are bent or an insulation tape and a semiconductor chip are not exactly aligned with each other.

To attain the above object, there is provided a semiconductor device comprising a semiconductor chip of a quadrangle, and bumps arranged in a staggered fashion along at least one side of the semiconductor chip. The bumps includes first bumps and second bumps arranged inside the first bumps. When each of the first bumps has a maximum width Bw1 and each of the second bumps has a maximum width Bw2 in a direction parallel to at least one side of the semiconductor chip, Bw2>Bw1.

According to the semiconductor device, when each of the first bumps has a maximum length Bd1 and each of the second bumps (17B) has a maximum length Bd2 in a direction perpendicular to at least one side of the semiconductor chip, Bd1>Bd2.

The semiconductor device further comprises an insulation tape having a quadrangular device hole, and leads formed on the insulation tape. One end of each of the leads extends into the device hole, the leads have long and short leads with respect to a distance between a predetermined side of the device hole and the respective ends of the long and short leads, and the long and short leads are arranged alternately. The semiconductor chip is located within the device hole. The short leads are connected to the first bumps, and the long leads are connected to the second bumps.

According to the semiconductor device, when a distance between halfway points of adjacent leads is Lp, $2 \times Lp \leq (Bw1+Bw2)$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing in detail a semiconductor chip of the semiconductor device of FIG. 1;

FIG. 12 is a plan view showing a semiconductor device according to an embodiment of the present invention;

FIG. 13 is a cross-sectional view taken along the line XIII—XIII of FIG. 12;

FIG. 14 is a view showing in detail a semiconductor chip of the semiconductor device of FIG. 12;

FIG. 15 is a plan view showing a semiconductor device according to another embodiment of the present invention;

FIG. 16 is a view showing in detail a semiconductor chip of the semiconductor device of FIG. 15;

FIG. 17 is an enlarged view of area B of the semiconductor device shown in FIG. 12 or area C of the semiconductor device shown in FIG. 15;

FIG. 18A is a cross-sectional view taken along the line XVIII—XVIII of FIG. 17;

FIG. 20 is another enlarged view of the area B or C;

FIG. 21A is a cross-sectional view taken along the line XXI—XXI of FIG. 20;

FIG. 21B is a side view of a semiconductor chip shown in FIG. 20;

FIG. 23(c) is an illustration of the present invention for comparison with the conventional semiconductor devices of FIGS. 23(a) and 23(b);

FIGS. 24(a) and 24(b) are examples of conventional semiconductor devices;

FIG. 24(c) is an illustration of the present invention for comparison with the conventional semiconductor devices of FIGS. 24(a) and 24(b);

DETAILED DESCRIPTION OF THE PREFERRED EMBODIMENTS

Figure 1:
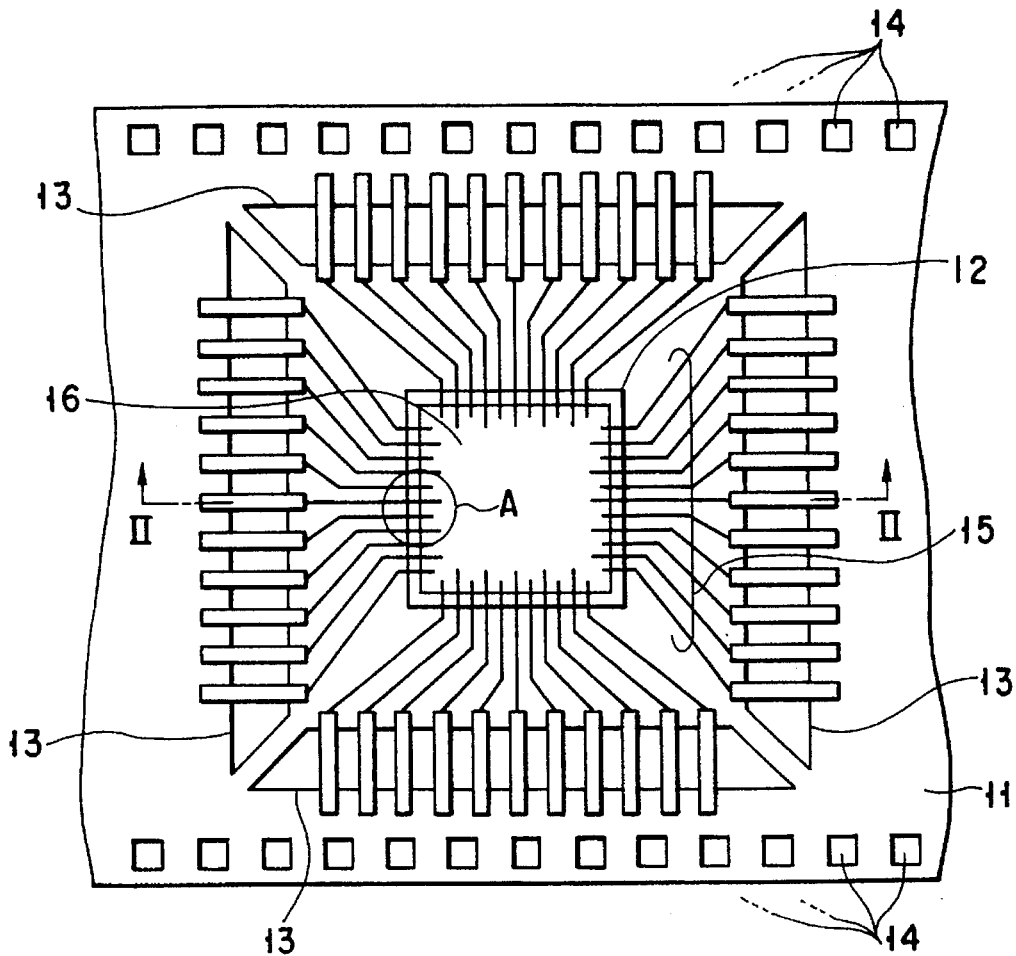
FIG. 1 is a plan view showing a conventional semiconductor device.
Figure 2:
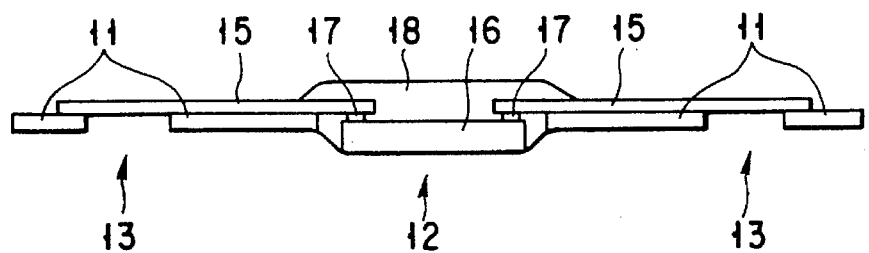
FIG. 2 is a cross-sectional view taken along the line II—II of FIG. 1.
Figure 3:
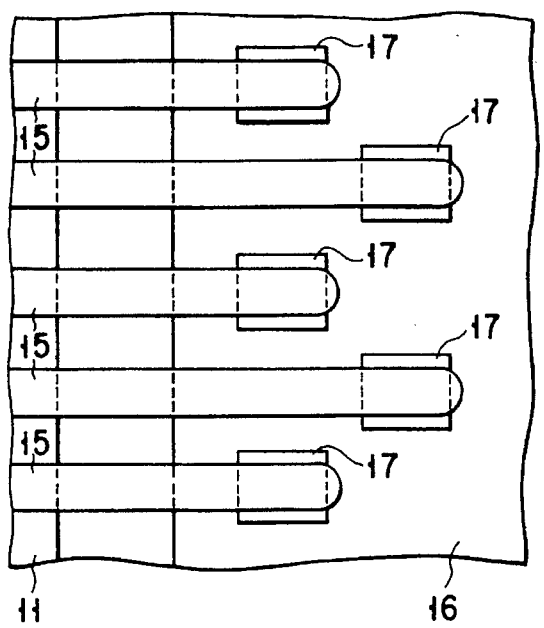
FIG. 3 is an enlarged view of area A of the semiconductor device shown in FIG. 1.
Figure 5:
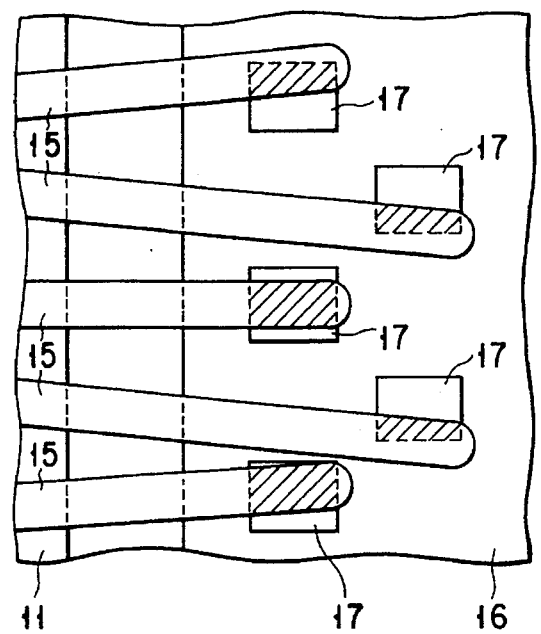
FIG. 5 is a view showing a case where the leads are bent in the area A shown in FIG. 3.
Figure 6:
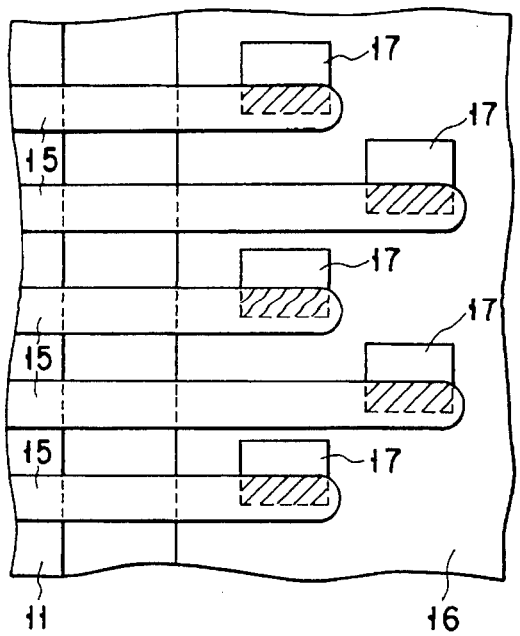
FIG. 6 is a view showing a case where the insulation tape and semiconductor chip are not aligned exactly in the area A shown in FIG. 3.
Figure 7:
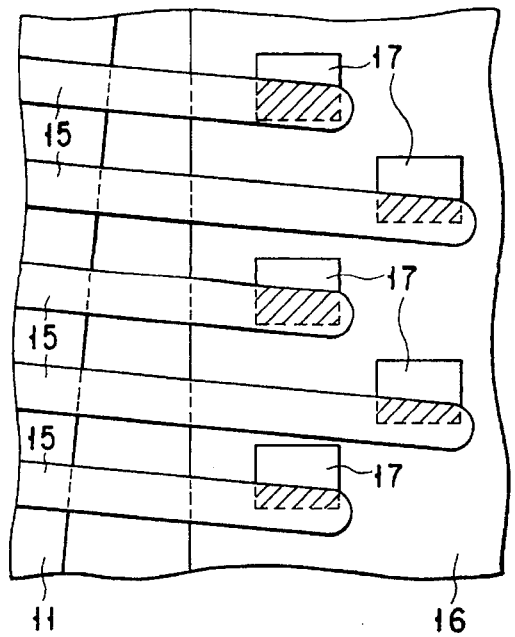
FIG. 7 is a view showing another case where the insulation tape and semiconductor chip are not aligned exactly in the area A shown in FIG. 3.
Figure 8:
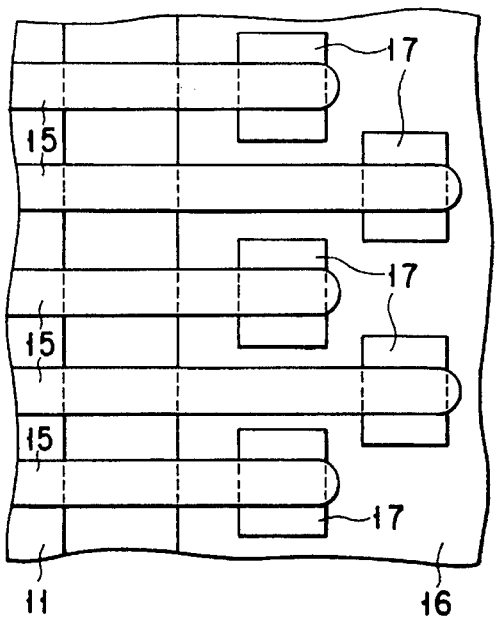
FIG. 8 is another enlarged view of the area A of the semiconductor device shown in FIG. 1.
Figure 9:
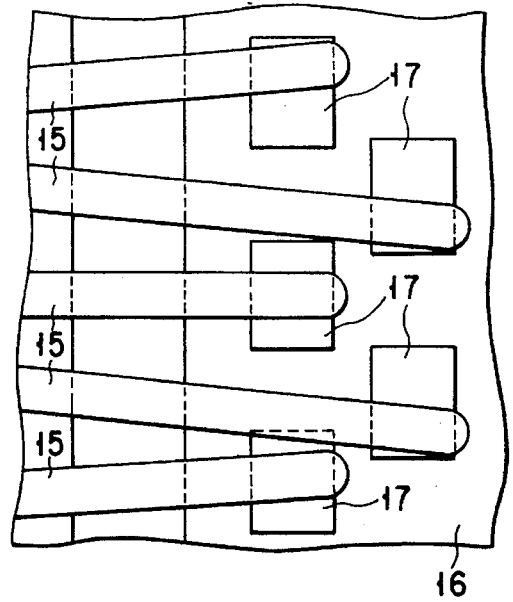
FIG. 9 is a view showing a case where the leads are bent in the area A shown in FIG. 8.
Figure 10:
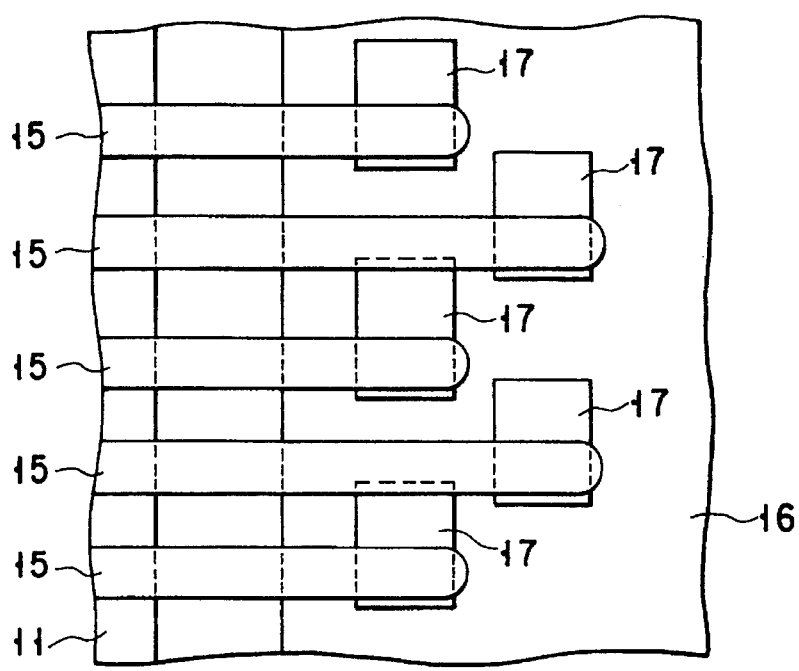
FIG. 10 is a view showing a case where the insulation tape and semiconductor chip are not aligned exactly in the area A shown in FIG. 8.
Figure 11:
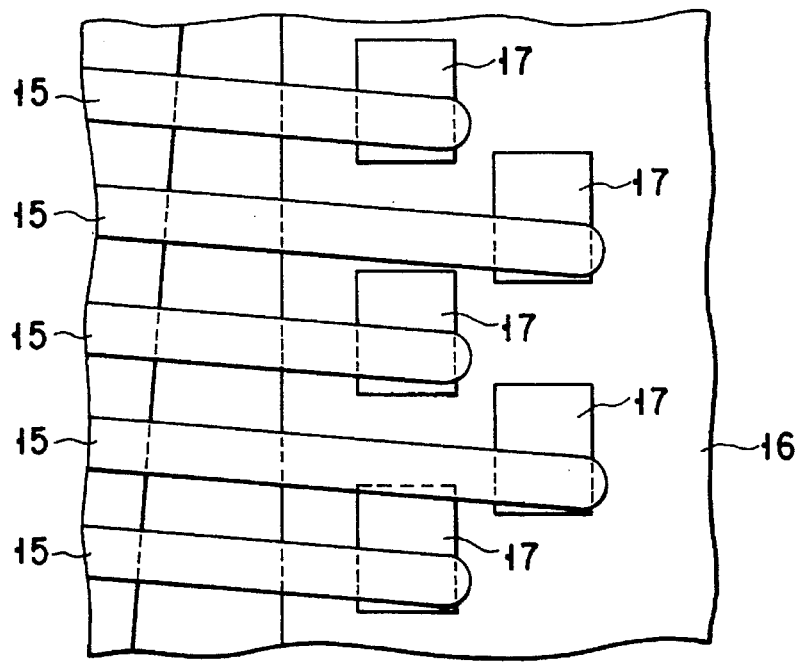
FIG. 11 is a view showing another case where the insulation tape and semiconductor chip are not aligned exactly in the area A shown in FIG. 8.

A semiconductor device of the present invention will now be described, with reference to the accompanying drawings.

FIG. 12 shows a TCP (Tape Carrier Package) according to an embodiment of the present invention, and FIG. 13 is a cross-sectional view taken along the line XIII—XIII of FIG. 12.

An insulation tape 11 includes a device hole 12, outer lead holes 13, and perforation holes 14. The outer lead holes 13 are arranged so as to surround the device hole 12. The perforation holes 14 are arranged along the two opposed sides of the insulation tape 11. Leads 15 are formed on the insulation tape 11, and each have one end extending into the device hole 12 and the other end extending outside the outer lead holes 13. A semiconductor chip 16 is located within the device hole 12. One end of each lead 15 is connected to its corresponding one of bumps 17 on the chip 16. The semiconductor chip 16 and its periphery are covered with resin 18. The insulation tape 11 is formed by resin such as polyimide and polyester. While the leads 15 are formed by, e.g., copper (Cu), the bumps 17 are formed by, e.g., gold (Au).

FIG. 14 is an enlarged view of the semiconductor chip 16 and its periphery shown in FIG. 12.

Bumps 17A and 17B are arranged in a staggered fashion on the periphery of the semiconductor chip 16 and, in other words, the bumps 17A and 17B are arranged on the periphery of the chip 16 so as to form a double ring. The bumps 17A forming the outer ring of the double ring differ in shape and size from the bumps 17B forming the inner ring thereof.

For example, each of the bumps 17A has a square, and each of the bumps 17B does a rectangle the long side of which is parallel to the edge of the semiconductor chip 16 and the short side of which is perpendicular thereto. The long side of each rectangular bump 17B is greater than the side of each square bump 17A, which is a condition of the device of this embodiment. The shape and size of the bumps 17A and 17B will be described later.

FIG. 15 shows a TCP according to another embodiment of the present invention.

An insulation tape 11 includes a device hole 12, outer lead holes 13, and perforation holes 14. The outer lead holes 13 are arranged so as to surround the device hole 12. The perforation holes 14 are arranged along the two opposed sides of the insulation tape 11. Leads 15 are formed on the insulation tape 11, and each have one end extending into the device hole 12 and the other end extending outside the outer lead holes 13. A semiconductor chip 16 is rectangular and located within the device hole 12. One end of each lead 15 is connected to its corresponding one of bumps 17 on the chip 16. The semiconductor chip 16 and its periphery are covered with resin 18. The insulation tape 11 is formed by resin such as polyimide and polyester. While the leads 15 are formed by, e.g., copper (Cu), the bumps 17 are formed by, e.g., gold (Au).

FIG. 16 is an enlarged view of the semiconductor chip 16 and its periphery shown in FIG. 15.

Bumps 17A and 17B are arranged in a staggered fashion along one long side and two short sides of the rectangular semiconductor chip 16, while the bumps 17 are arranged in line along the other long side thereof at wide pitches.

The bumps 17A differ from the bumps 17B in shape and size. For example, each of the bumps 17A has a square, and each of the bumps 17B does a rectangle the long side of which is parallel to the edge of the semiconductor chip 16 and the short side of which is perpendicular thereto. The long side of each rectangular bump 17B is greater than the side of each square bump 17A, which is also a condition of the device of this embodiment. The shape and size of the bumps 17A and 17B will be described later. All the bumps 17 have the same shape, e.g., a square shape. The shape and size of the bumps 17A and 17B will be described later.

FIG. 17 is an enlarged plan view of area B of the semiconductor device shown in FIG. 12 or area C of the semiconductor device shown in FIG. 15, and FIG. 18A is a cross-sectional view taken along the line XVIII—XVIII of FIG. 17.

There are two distances between the edge E of the device hole 12 and one end of each of the leads 15 since the long and short leads 15 are alternated with each other. While the short leads 15 are connected to the outer bumps 17, the short ones are connected to the inner bumps 17.

In FIG. 17, Lw represents a width of each lead 15, and Lp does a lead pitch which is a distance between the halfway points of adjacent leads 15. The lead pitch Lp is equal to a bump pitch which is a distance between the central portions of adjacent outer and inner bumps.

The lead width Lw depends upon the lead pitch Lp. For example, as shown in Table 1, the lead width Lw is about 35μ when the lead pitch Lp is about 80μ, Lw is about 30μ when Lp is about 60μ, and Lw is about 25μ when Lp is about 50μ.

In FIG. 17, Bw1 indicates a width of each of the outer bumps 17A and, in other words, the maximum width of each of the bumps 17A which are parallel to one side F of the chip 16 contacting the bumps 17A. The width Bw1 is defined irrespective of the shape of the bumps 17A. Therefore, the bumps 17A can be shaped like a triangle, a polygon, a rectangle, a circle, an ellipse or the like, in addition to the square as shown.

However, the most suitable shape therefor is a quadrangle such as a square and a rectangle. If the outer bumps 17A are of a square, the width Bw1 corresponds to one side of the square.

Figure 18B:
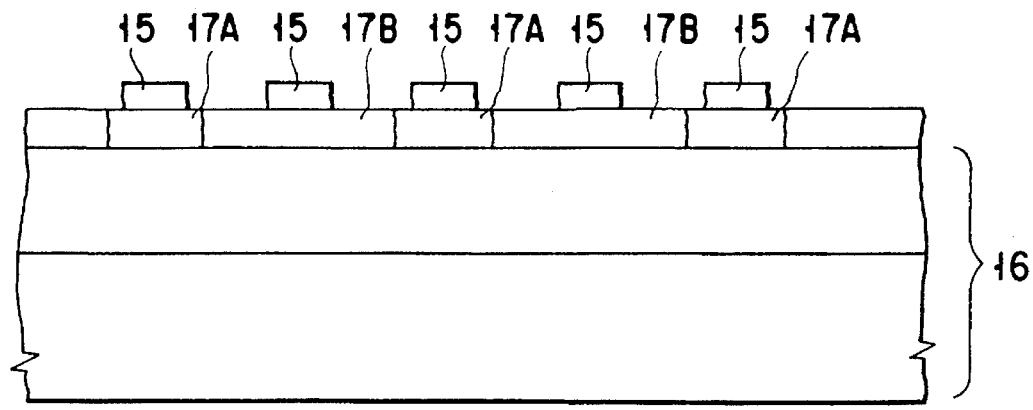
FIG. 18B is a side view of a semiconductor chip shown in FIG. 17.

In FIG. 17, Bw2 indicates a width of each of the inner bumps 17B and, in other words, the maximum width of each of the bumps 17B which are parallel to one side F of the chip 16 contacting the bumps 17B. The width Bw2 is defined irrespective of the shape of the bumps 17B. Therefore, the bumps 17B can be shaped like a triangle, a polygon, a square, a circle, an ellipse or the like, in addition to the rectangle as shown. However, the most suitable shape therefor is a quadrangle such as a square and a rectangle. If the inner bumps 17B are of a rectangle, the width Bw2 corresponds to the longer side of the rectangle. However, the longer side of the rectangle has to be parallel to one side of the chip. The semiconductor device shown in FIGS. 17, 18A and 18B is featured in that the width Bw2 is greater than the width Bw1 (Bw2>Bw1). For example, as shown in Table 1, when the lead pitch (bump pitch) Lp is about 60μ, the width Bw2 is set to be about 80μ, and the width Bw1 is set to be about 40μ. However, the specific numeric values of Bw1 and Bw2 are not significant. The semiconductor device is satisfied if the condition that Bw2>Bw1 is met.

As is apparent from FIG. 18B showing the side of the semiconductor chip 16, the outer and inner bumps 17A and 17B do not overlap each other.

TABLE 1

|  | Lead Pitch (Lp) | Lead Width (Lw) | Bump Width (Bw1) | Bump Width (Bw2) |
| --- | --- | --- | --- | --- |
| Present Invention (μm) | 80 | 35 | 60 | 100 |
|  | 60 | 30 | 40 | 80 |
|  | 50 | 25 | 35 | 65 |
| Prior Art (μm) | 80 | 35 | 70 | 70 |
|  | 60 | 30 | 50 | 50 |
|  | 50 | 25 | 40 | 40 |

According to the semiconductor device having the above constitution, the leads 15 and bumps 17A and 17B are arranged so as to deal with the problems of an increase in the number of pins and a reduction in the pin pitch. Since the width Bw2 of the inner bumps 17B is greater than the width Bw1 of the outer bumps 17A (Bw2>Bw1), no short circuit occurs between adjacent leads 15 even though the leads 15 are bent or the insulation tape 11 and chip 16 are shifted in position from each other.

Figure 19:
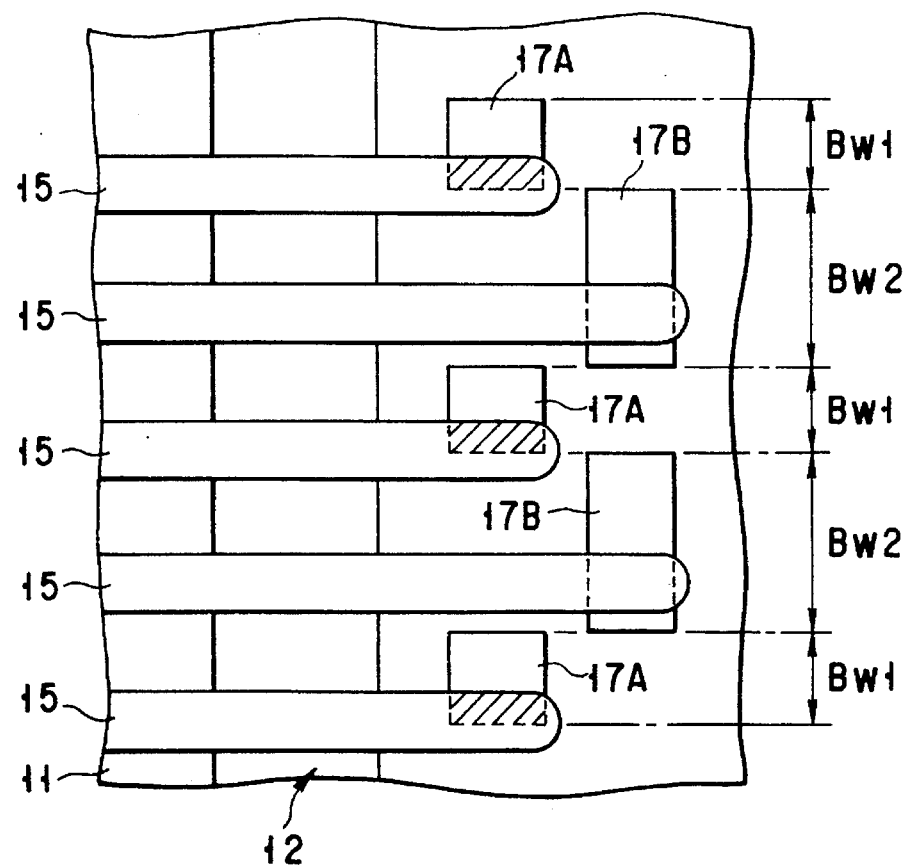
FIG. 19 is a view showing a case where the insulation tape and semiconductor chip are not aligned exactly in the area shown in FIG. 17.

· FIG. 19 is a view showing a case where the insulation tape 11 and semiconductor chip 16 are not aligned exactly but displaced from each other. In this case, the width Bw2 of each of the inner bumps 17B is greater than the width Bw1 of each of the outer bumps 17A (Bw2>Bw1); therefore, no short circuit occurs between adjacent leads 15. Since the leads 15 are always located on the inner bumps 17, the bonding strength between them is considerably increased. However, the overlapping regions of the leads 15 and bumps 17A, indicated by hatching, reduce as the bent of the leads becomes greater. Inevitably the reduction in the overlapping regions lowers the bonding strength of the leads 15 and bumps 17.

FIG. 20 is another enlarged plan view of area B or C of the semiconductor device shown in FIG. 12, and FIG. 21A is a cross-sectional view taken along the line XXI—XXI of FIG. 20. The device shown in FIGS. 20, 21A and 21B have a structure capable of eliminating the drawback of the device of FIG. 17 in which the bonding strength is lowered.

The structure of the semiconductor device shown in FIGS. 20 and 21 will now be described.

There are two distances between the edge E of the device hole 12 and one end of each of the leads 15 since the long and short leads 15 are alternated with each other. While the short leads 15 are connected to the outer bumps 17, the short ones are connected to the inner bumps 17.

In FIG. 20, Lw represents a width of each lead 15, and Lp does a lead pitch which is a distance between the halfway points of adjacent leads 15. The lead pitch Lp is equal to a bump pitch which is a distance between the central portions of adjacent outer and inner bumps.

The lead width Lw depends upon the lead pitch Lp. For example, as shown in Table 2, the lead width Lw is about 35μ when the lead pitch Lp is about 80μ, Lw is about 30μ when Lp is about 60μ, and Lw is about 25μ when Lp is about 50μ.

In FIG. 20, Bw1 indicates a width of each of the outer bumps 17A and, in other words, the maximum width of each of the bumps 17A which are parallel to one side F of the chip 16 contacting the bumps 17A. The width Bw1 is defined irrespective of the shape of the bumps 17A. Therefore, the bumps 17A can be shaped like a triangle, a polygon, a square, a circle, an ellipse or the like, in addition to the rectangle as shown. However, the most suitable shape therefor is a quadrangle such as a square and a rectangle. If the outer bumps 17A are of a rectangle, the width Bw1 corresponds to the shorter side of the rectangle. However, the shorter side of the rectangle has to be parallel to one side of the chip.

In FIG. 20, Bw2 indicates a width of each of the inner bumps 17B and, in other words, the maximum width of each of the bumps 17B which are parallel to one side F of the chip 16 contacting the bumps 17B. The width Bw2 is defined irrespective of the shape of the bumps 17B. Therefore, the bumps 17B can be shaped like a triangle, a polygon, a square, a circle, an ellipse or the like, in addition to the rectangle as shown. However, the most suitable shape therefor is a quadrangle such as a square and a rectangle. If the inner bumps 17B are of a rectangle, the width Bw2 corresponds to the longer side of the rectangle. However, the longer side of the rectangle has to be parallel to one side of the chip.

In FIG. 20, Bd1 denotes the length of each of the outer bumps 17A and, in other words, the maximum length of each of the bumps 17A which are perpendicular to one side F of the chip 16 contacting the bumps 17A. The length Bd1 is defined irrespective of the shape of the bumps 17A. Therefore, the bumps 17A can be shaped like a triangle, a polygon, a square, a circle, an ellipse or the like, in addition to the rectangle as shown. However, the most suitable shape therefor is a quadrangle such as a square and a rectangle. If the outer bumps 17A are of a rectangle, the length Bd1 corresponds to the longer side of the rectangle. However, the longer side of the rectangle has to be perpendicular to one side of the chip.

In FIG. 20, Bd2 denotes the length of each of the inner bumps 17B and, in other words, the maximum length of each of the bumps 17B which are perpendicular to the side F of the chip 16 contacting the bumps 17B. The length Bd2 is defined irrespective of the shape of the bumps 17B. Therefore, the bumps 17B can be shaped like a triangle, a polygon, a square, a circle, an ellipse or the like, in addition to the rectangle as shown. However, the most suitable shape therefor is a quadrangle such as a square and a rectangle. If the inner bumps 17B are of a rectangle, the length Bd2 corresponds to the shorter side of the rectangle. However, the shorter side of the rectangle has to be perpendicular to one side of the chip.

The semiconductor device shown in FIGS. 20, 21A and 21B is featured in that the length Bd1 is greater than the length Bd2 (Bd1>Bd2). For example, as shown in Table 2, when the lead pitch (bump pitch) Lp is about 60μ, the width Bw2 is about 80μ, and the width Bw1 is about 40μ, the length Bd1 is set to be about 80μ and the length Bd2 is set to be about 40μ. However, the specific numeric values of Bd1 and Bd2 are not significant. The semiconductor device is satisfied if the condition that Bd1>Bd2 is met.

As is apparent from FIG. 21B showing the side of the semiconductor chip 16, the outer and inner bumps 17A and 17B do not overlap each other.

TABLE 2

| | Lead Pitch (Lp) | Lead Width (Lw) | Bump Width (Bw1) | Bump Width (Bw2) | Bump Length (Bd1) | Bump Length (Bd2) |
| --- | --- | --- | --- | --- | --- | --- |
| Present Invention (μm) | 80 | 35 | 60 | 100 | 100 | 60 |
| | 60 | 30 | 40 | 80 | 80 | 40 |
| | 50 | 25 | 35 | 65 | 65 | 35 |
| Prior Art (μm) | 80 | 35 | 70 | 70 | 70 | 70 |
| | 60 | 30 | 50 | 50 | 50 | 50 |
| | 50 | 25 | 40 | 40 | 40 | 40 |

According to the semiconductor device having the above constitution, the leads 15 and bumps 17A and 17B are arranged so as to deal with the problems of an increase in the number of pins and a reduction in the pin pitch. Since the width Bw2 of the inner bumps 17B is greater than the width Bw1 of the outer bumps 17A (Bw2>Bw1), no short circuit occurs between adjacent leads 15 even though the leads 15 are bent or the insulation tape 11 and chip 16 are shifted in position from each other.

Since, furthermore, the length Bd1 of the outer bumps 17A is greater than the length Bd2 of the inner bumps 17B (Bd1>Bd2), the bonding strength between the leads 15 and outer bumps 17A is not lowered even though the leads 15 are bent or the insulation tape 11 and chip 16 are shifted in position from each other.

Figure 22A:
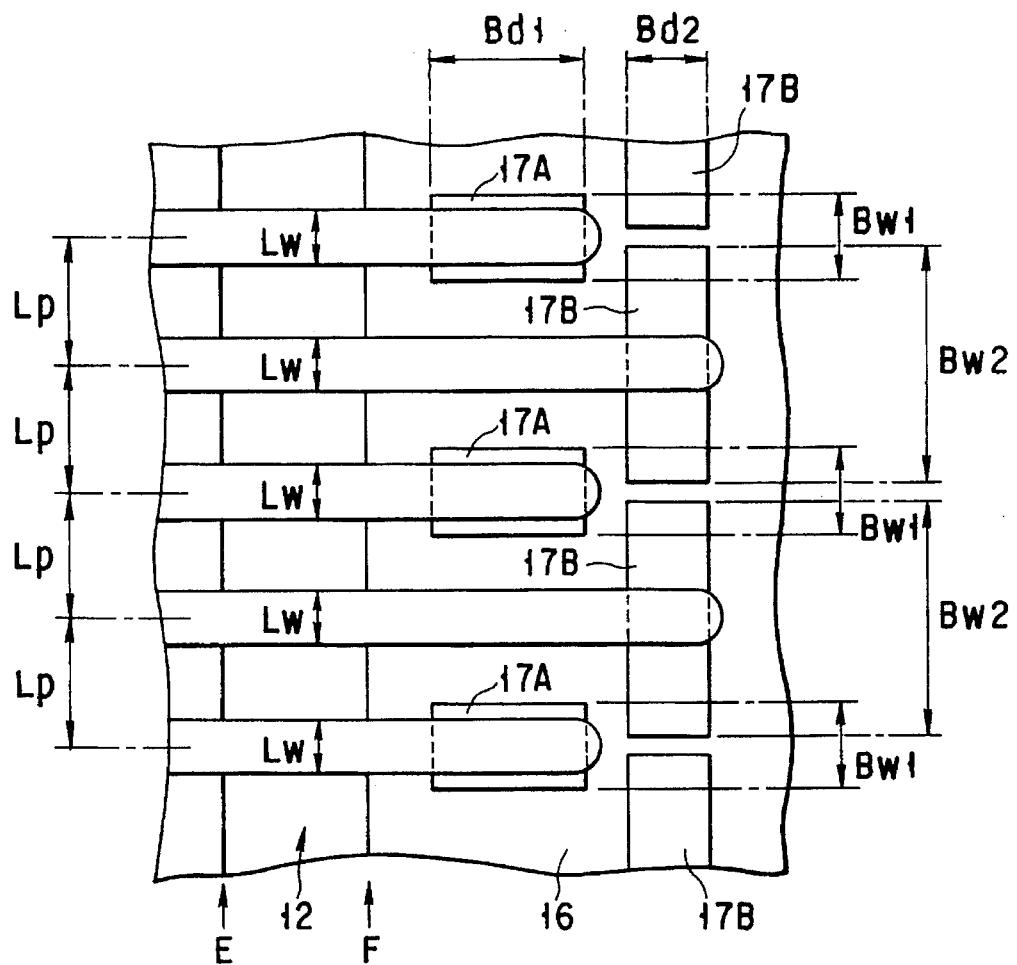
FIG. 22A is still another enlarged view of the area B or C.
Figure 22B:
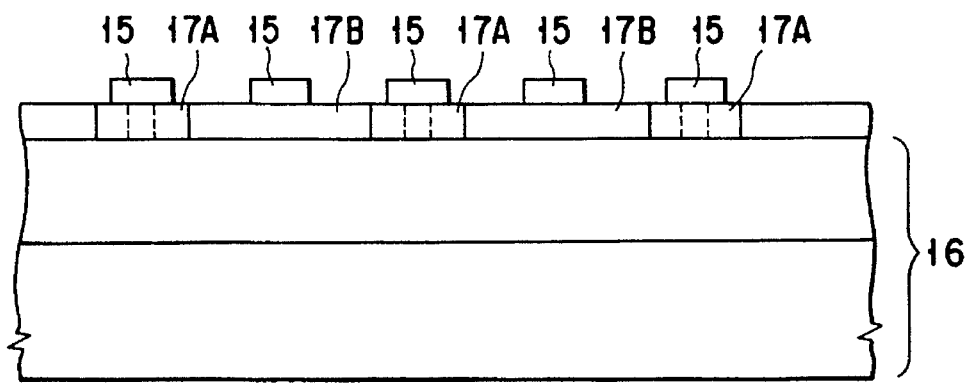
FIG. 22B is a side view of a semiconductor chip shown in FIG. 22A.

FIG. 22A is still another enlarged plan view of area B or C of the semiconductor device shown in FIG. 12, and FIG. 22B is a side view of the area shown in FIG. 22A. FIGS. 22A and 22B show a modification to the semiconductor device of FIG. 20, and the structure thereof will be described.

There are two distances between the edge E of the device hole 12 and one end of each of the leads 15 since the long and short leads 15 are alternated with each other. While the short leads 15 are connected to the outer bumps 17, the short ones are connected to the inner bumps 17.

In FIG. 22A, Lw represents a width of each lead 15, and Lp does a lead pitch which is a distance between the halfway points of adjacent leads 15. The lead pitch Lp is equal to a bump pitch which is a distance between the central portions of adjacent outer and inner bumps.

The lead width Lw depends upon the lead pitch Lp. For example, as shown in Table 3, the lead width Lw is about 35μ when the lead pitch Lp is about 80μ, Lw is about 30μ when Lp is about 60μ, and Lw is about 25μ when Lp is about 50μ.

In FIG. 22A, Bw1 indicates a width of each of the outer bumps 17A and, in other words, the maximum width of each of the bumps 17A which are parallel to one side F of the chip 16 contacting the bumps 17A. The width Bw1 is defined irrespective of the shape of the bumps 17A. Therefore, the bumps 17A can be shaped like a triangle, a polygon, a square, a circle, an ellipse or the like, in addition to the rectangle as shown. However, the most suitable shape therefor is a quadrangle such as a square and a rectangle. If the outer bumps 17A are of a rectangle, the width Bw1 corresponds to the shorter side of the rectangle. However, the shorter side of the rectangle has to be parallel to one side of the chip.

In FIG. 22A, Bw2 indicates a width of each of the inner bumps 17B and, in other words, the maximum width of each of the bumps 17B which are parallel to one side F of the chip 16 contacting the bumps 17B. The width Bw2 is defined irrespective of the shape of the bumps 17B. Therefore, the bumps 17B can be shaped like a triangle, a polygon, a square, a circle, an ellipse or the like, in addition to the rectangle as shown. However, the most suitable shape therefor is a quadrangle such as a square and a rectangle. If the inner bumps 17B are of a rectangle, the width Bw2 corresponds to the longer side of the rectangle. However, the longer side of the rectangle has to be parallel to one side of the chip.

In FIG. 22A, Bd1 denotes the length of each of the outer bumps 17A and, in other words, the maximum length of each of the bumps 17A which are perpendicular to one side F of the chip 16 contacting the bumps 17A. The length Bd1 is defined irrespective of the shape of the bumps 17A. Therefore, the bumps 17A can be shaped like a triangle, a polygon, a square, a circle, an ellipse or the like, in addition to the rectangle as shown. However, the most suitable shape therefor is a quadrangle such as a square and a rectangle. If the outer bumps 17A are of a rectangle, the length Bd1 corresponds to the longer side of the rectangle. However, the longer side of the rectangle has to be perpendicular to one side of the chip.

In FIG. 22A, Bd2 denotes the length of each of the inner bumps 17B and, in other words, the maximum length of each of the bumps 17B which are perpendicular to the side F of the chip 16 contacting the bumps 17B. The length Bd2 is defined irrespective of the shape of the bumps 17B. Therefore, the bumps 17B can be shaped like a triangle, a polygon, a square, a circle, an ellipse or the like, in addition to the rectangle as shown. However, the most suitable shape therefor is a quadrangle such as a square and a rectangle. If the inner bumps 17B are of a rectangle, the length Bd2 corresponds to the shorter side of the rectangle. However, the shorter side of the rectangle has to be perpendicular to one side of the chip.

As is apparent from FIG. 22B showing the side of the semiconductor chip 16, the outer and inner bumps 17A and 17B overlap each other.

The semiconductor device shown in FIGS. 22A and 22B is featured in that the width Bw2 of the bumps 17B is greater than the width Bw1 of the bumps 17A (Bw2>Bw1) and the length Bd1 of the bumps 17A is greater than the length Bd2 of the bumps 17B (Bd1>Bd2).

Table 3 shows the specific numeric values of Bw1, Bd1, Bw2 and Bd2. However, the values are not significant. The semiconductor device is satisfied if the condition that Bw2>Bw1 and Bd1>Bd2 is met.

TABLE 3

| | Lead Pitch (Lp) | Lead Width (Lw) | Bump Width (Bw1) | Bump Width (Bw2) | Bump Length (Bd1) | Bump Length (Bd2) |
|---|---|---|---|---|---|---|
| Present Invention (μm) | 80 | 35 | 60 | 150 | 100 | 60 |
| | 60 | 30 | 40 | 110 | 80 | 40 |
| | 50 | 25 | 35 | 95 | 65 | 35 |
| Prior Art (μm) | 80 | 35 | 70 | 70 | 70 | 70 |
| | 60 | 30 | 50 | 50 | 50 | 50 |
| | 50 | 25 | 40 | 40 | 40 | 40 |

According to the semiconductor device having the above constitution, the leads 15 and bumps 17A and 17B are arranged so as to deal with the problems of an increase in the number of pins and a reduction in the pin pitch. Since the width Bw2 of the inner bumps 17B is greater than the width Bw1 of the outer bumps 17A (Bw2>Bw1), no short circuit occurs between adjacent leads 15 even though the leads 15 are bent or the insulation tape 11 and chip 16 are shifted in position from each other.

Since, furthermore, the length Bd1 of the outer bumps 17A is greater than the length Bd2 of the inner bumps 17B (Bd1>Bd2), the bonding strength between the leads 15 and outer bumps 17A is not lowered even though the leads 15 are bent or the insulation tape 11 and chip 16 are shifted in position from each other.

Figure 23A:
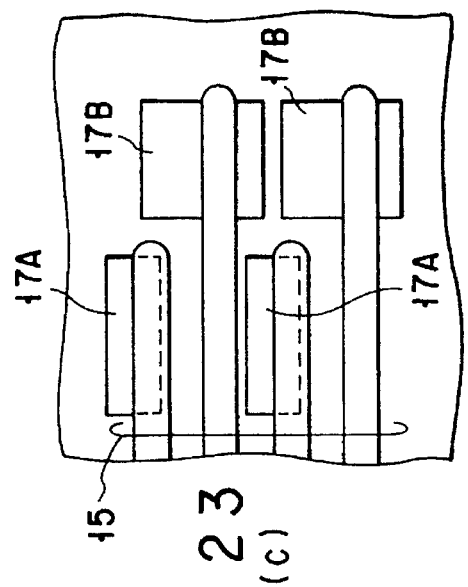
FIGS. 23(a), and 23(b) are examples of conventional semiconductor devices.
Figure 23A:
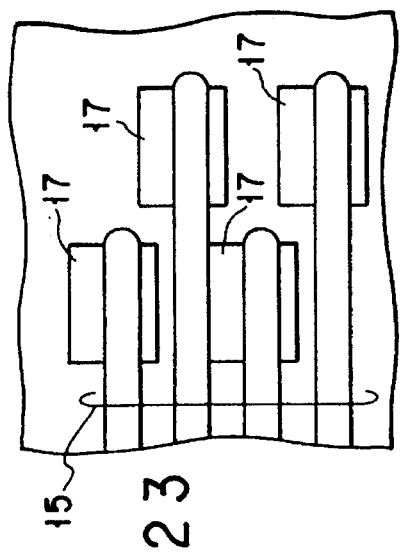

FIGS. 23 and 24 are views for explaining the structures and advantages of the semiconductor device of the present invention and the structures and disadvantages of the conventional semiconductor device.

Figure 23B:
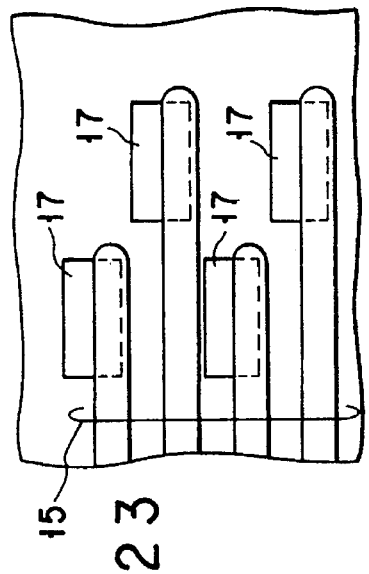

In the conventional semiconductor device, all the bumps 17 have the same shape and the same size. If, therefore, the bumps 17 are increased in size, the leads 15 are short-circuited with each other because of a bent or displacement of the leads 15, as shown in FIGS. 23(a) and 24(a). If the bumps 17 are decreased in size, the contact area of the leads 15 and bumps 17 is reduced because of a bent or displacement of the leads 15, as shown in FIGS. 23(b) and 24(b), and the bonding strength between them is lowered accordingly.

In the semiconductor device of the present invention, the outer bumps 17A differ from the inner bumps 17B in shape and size, and the bumps 17A and 17B meet the condition that Bw2>Bw1 and Bd1>Bd2. Consequently, the leads 15 are not short-circuited or the contact area of the leads 15 and bumps 17A is not decreased, even though the leads 15 are bent or displaced as shown in FIGS. 23(c) and 24(c).

Figure 25:
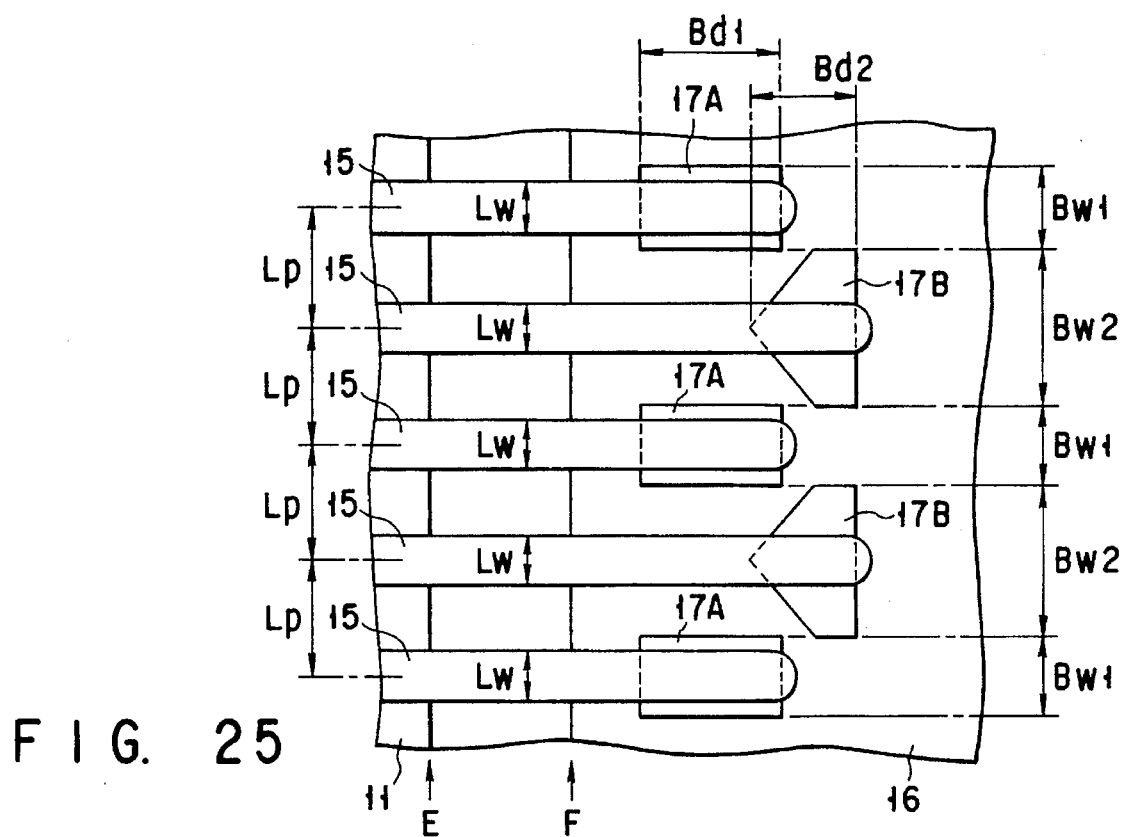
FIG. 25 is another enlarged view of the area B or C.

FIG. 25 is another enlarged plan view of area B shown in FIG. 12 or area C shown in FIG. 15. FIG. 25 shows a modification to the semiconductor device of FIG. 20, and the structure thereof will now be described.

There are two distances between the edge E of the device hole 12 and one end of each of the leads 15 since the long and short leads 15 are alternated with each other. While the short leads 15 are connected to the outer bumps 17, the short ones are connected to the inner bumps 17.

In FIG. 25, Lw represents a width of each lead 15, and Lp does a lead pitch which is a distance between the halfway points of adjacent leads 15. The lead pitch Lp is equal to a bump pitch which is a distance between the central portions of adjacent outer and inner bumps.

The lead width Lw depends upon the lead pitch Lp. For example, the lead width Lw is about 35μ when the lead pitch Lp is about 80μ, Lw is about 30μ when Lp is about 60μ, and Lw is about 25μ when Lp is about 50μ.

In FIG. 25, Bw1 indicates a width of each of the outer bumps 17A and, in other words, the maximum width of each of the bumps 17A which are parallel to one side F of the chip 16 contacting the bumps 17A. The width Bw1 is defined irrespective of the shape of the bumps 17A. Therefore, the bumps 17A can be shaped like a triangle, a polygon, a square, a circle, an ellipse or the like, in addition to the rectangle as shown. If the outer bumps 17A are of a rectangle, the width Bw1 corresponds to the shorter side of the rectangle. However, the shorter side of the rectangle has to be parallel to one side of the chip.

In FIG. 25, Bw2 indicates a width of each of the inner bumps 17B and, in other words, the maximum width of each of the bumps 17B which are parallel to one side F of the chip 16 contacting the bumps 17B. The width Bw2 is defined irrespective of the shape of the bumps 17B. Therefore, the bumps 17B can be shaped like a triangle, a polygon, a square, a circle, an ellipse or the like, in addition to the home plate of baseball as shown.

In FIG. 25, Bd1 denotes the length of each of the outer bumps 17A and, in other words, the maximum length of each of the bumps 17A which are perpendicular to one side F of the chip 16 contacting the bumps 17A. The length Bd1 is defined irrespective of the shape of the bumps 17A. Therefore, the bumps 17A can be shaped like a triangle, a polygon, a square, a circle, an ellipse or the like, in addition to the rectangle as shown. If the outer bumps 17A are of a rectangle, the length Bd1 corresponds to the longer side of the rectangle. However, the longer side of the rectangle has to be perpendicular to one side of the chip.

In FIG. 25, Bd2 denotes the length of each of the inner bumps 17B and, in other words, the maximum length of each of the bumps 17B which are perpendicular to the side F of the chip 16 contacting the bumps 17B. The length Bd2 is defined irrespective of the shape of the bumps 17B. Therefore, the bumps 17B can be shaped like a triangle, a polygon, a square, a circle, an ellipse or the like, in addition to the home plate of baseball as shown.

viewing the semiconductor device shown in FIG. 25 from its side, the outer and inner bumps 17A and 17B do not overlap each other.

The device of FIG. 25 is featured in that the width Bw2 of the bumps 17B is greater than the width Bw1 of the bumps 17A (Bw2>Bw1) and the length Bd1 of the bumps 17A is greater than the length Bd2 of the bumps 17B (Bd1>Bd2).

Since the bumps 17B are shaped like a home plate, each of them can be located close to its adjacent bumps 17A.

According to the semiconductor device having the above constitution, the leads 15 and bumps 17A and 17B are arranged so as to deal with the problems of an increase in the number of pins and a reduction in the pin pitch. Since the width Bw2 of the inner bumps 17B is greater than the width Bw1 of the outer bumps 17A (Bw2>Bw1), no short circuit occurs between adjacent leads 15 even though the leads 15 are bent or the insulation tape 11 and chip 16 are shifted in position from each other.

Since, furthermore, the length Bd1 of the outer bumps 17A is greater than the length Bd2 of the inner bumps 17B (Bd1>Bd2), the bonding strength between the leads 15 and outer bumps 17A is not lowered even though the leads 15 are bent or the insulation tape 11 and chip 16 are shifted in position from each other.

Moreover, each of the bumps 17B can be located close to its adjacent bumps 17A, so that the semiconductor chip 16 can be decreased in size.

Figure 26:
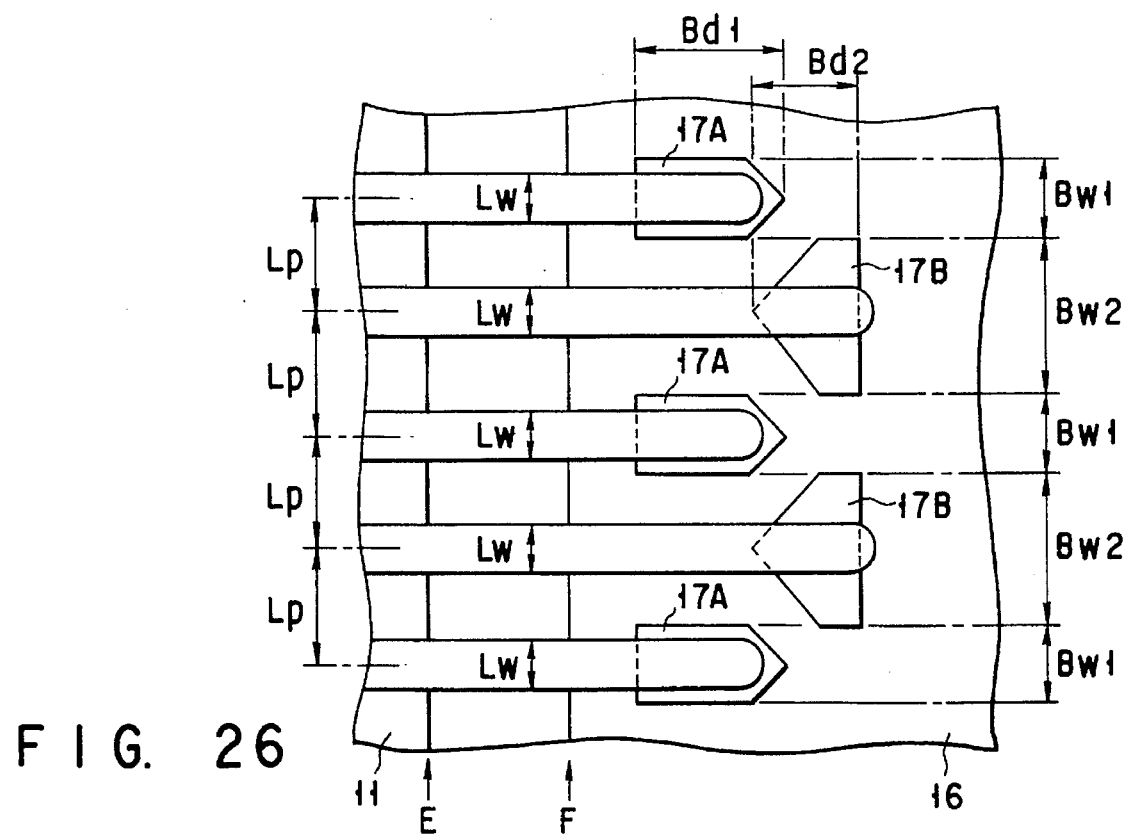
FIG. 26 is another enlarged view of the area B or C.

FIG. 26 is still another enlarged plan view of area B shown in FIG. 12 or area C shown in FIG. 15. FIG. 26 shows a modification to the semiconductor device of FIG. 20, and the structure thereof will now be described.

There are two distances between the edge E of the device hole 12 and one end of each of the leads 15 since the long and short leads 15 are alternated with each other. While the short leads 15 are connected to the outer bumps 17, the short ones are connected to the inner bumps 17.

In FIG. 26, Lw represents a width of each lead 15, and Lp does a lead pitch which is a distance between the halfway points of adjacent leads 15. The lead pitch Lp is equal to a bump pitch which is a distance between the central portions of adjacent outer and inner bumps.

The lead width Lw depends upon the lead pitch Lp. For example, the lead width Lw is about 35μ when the lead pitch Lp is about 80μ, Lw is about 30μ when Lp is about 60μ, and Lw is about 25μ when Lp is about 50μ.

In FIG. 26, Bw1 indicates a width of each of the outer bumps 17A and, in other words, the maximum width of each of the bumps 17A which are parallel to one side F of the chip 16 contacting the bumps 17A. The width Bw1 is defined irrespective of the shape of the bumps 17A. Therefore, the bumps 17A can be shaped like a triangle, a polygon, a square, a rectangle, a circle, an ellipse or the like, in addition to a home plate of baseball as shown.

In FIG. 26, Bw2 indicates a width of each of the inner bumps 17B and, in other words, the maximum width of each of the bumps 17B which are parallel to one side F of the chip 16 contacting the bumps 17B. The width Bw2 is defined irrespective of the shape of the bumps 17B. Therefore, the bumps 17B can be shaped like a triangle, a polygon, a square, a circle, an ellipse or the like, in addition to the home plate of baseball as shown.

In FIG. 26, Bd1 denotes the length of each of the outer bumps 17A and, in other words, the maximum length of each of the bumps 17A which are perpendicular to one side F of the chip 16 contacting the bumps 17A. The length Bd1 is defined irrespective of the shape of the bumps 17A. Therefore, the bumps 17A can be shaped like a triangle, a polygon, a square, a rectangle, a circle, an ellipse or the like, in addition to a home plate of baseball as shown.

In FIG. 26, Bd2 denotes the length of each of the inner bumps 17B and, in other words, the maximum length of each of the bumps 17B which are perpendicular to the side F of the chip 16 contacting the bumps 17B. The length Bd2 is defined irrespective of the shape of the bumps 17B. Therefore, the bumps 17B can be shaped like a triangle, a polygon, a square, a circle, an ellipse or the like, in addition to the home plate of baseball as shown.

Viewing the semiconductor device shown in FIG. 25 from its side, the outer and inner bumps 17A and 17B do not overlap each other.

The device of FIG. 25 is featured in that the width Bw2 of the bumps 17B is greater than the width Bw1 of the bumps 17A (Bw2>Bw1) and the length Bd1 of the bumps 17A is greater than the length Bd2 of the bumps 17B (Bd1>Bd2).

Since the bumps 17A and 17B are shaped like a home plate, each of the bumps 17B can be located close to its adjacent bumps 17A.

According to the semiconductor device having the above constitution, the leads 15 and bumps 17A and 17B are arranged so as to deal with the problems of an increase in the number of pins and a reduction in the pin pitch. Since the width Bw2 of the inner bumps 17B is greater than the width Bw1 of the outer bumps 17A (Bw2>Bw1), no short circuit occurs between adjacent leads 15 even though the leads 15 are bent or the insulation tape 11 and chip 16 are shifted in position from each other.

Since, furthermore, the length Bd1 of the outer bumps 17A is greater than the length Bd2 of the inner bumps 17B (Bd1>Bd2), the bonding strength between the leads 15 and outer bumps 17A is not lowered even though the leads 15 are bent or the insulation tape 11 and chip 16 are shifted in position from each other.

Moreover, each of the bumps 17B can be located close to its adjacent bumps 17A, so that the semiconductor chip 16 can be decreased in size.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a semiconductor chip having a plurality of linear sides; and
   bumps arranged in a staggered fashion along at least one side of said semiconductor chip, said bumps including first bumps and second bumps arranged inside the first bumps,
   each of said first bumps having a maximum width Bw1 in a direction parallel to said at least one side and each of said second bumps having a maximum width Bw2 in said parallel direction, all of the first and second bumps satisfying a condition in which Bw2>Bw1.

2. The semiconductor device according to claim 1, wherein said semiconductor chip has a shape of one of a square and a rectangle.

3. The semiconductor device according to claim 1, wherein said bumps are arranged in a staggered fashion along all sides of said semiconductor chip.

4. The semiconductor device according to claim 1, wherein each of said bumps has a shape of one of a square and a rectangle, and at least one side of each of said bumps is parallel to said at least one side of said semiconductor chip.

5. The semiconductor device according to claim 1, wherein each of said bumps has a shape of a pentagon having three right angles and being symmetrical on an axis intersecting one of the right angles.

6. The semiconductor device according to claim 1, wherein each of said first bumps has a maximum length Bd1 in a direction perpendicular to said at least one side and each of said second bumps has a maximum length Bd2 in said perpendicular direction, all of the first and second bumps satisfying a condition in which Bd1>Bd2.

7. The semiconductor device according to claim 1, wherein said bumps are formed by gold.

8. The semiconductor device according to claim 1, further comprising:
   an insulation tape having a quadrangular device hole; and
   leads formed on said insulation tape, one end of each of said leads extending into the device hole, said leads having long and short leads with respect to a distance between a predetermined side of the device hole and respective ends of said long and short leads, said long and short leads being arranged alternately,
   wherein said semiconductor chip is located within the device hole, said short leads are connected to the first bumps, and said long leads are connected to the second bumps.

9. The semiconductor device according to claim 8, wherein said device hole has a same shape as that of said semiconductor chip.

10. The semiconductor device according to claim 8, wherein said leads are arranged on said insulation tape at regular intervals.

11. The semiconductor device according to claim 8, wherein each of said leads has a width Lw, all of said leads satisfying a condition in which Lw<Bw1 and a condition in which Lw<Bw2.

12. The semiconductor device according to claim 8, wherein halfway points of adjacent leads are spaced by a distance Lp, and 2×Lp≦(Bw1+Bw2).

13. The semiconductor device according to claim 8, wherein, when said first bumps has a maximum length Bd1 and said second bumps has a maximum length Bd2 in the direction perpendicular to said at least one side of said semiconductor chip, Bd1>Bd2.

14. The semiconductor device according to claim 8, wherein said insulation tape is formed by polyimide, and said leads are formed by copper.

* * * * *